(12) United States Patent
Lee et al.

(10) Patent No.: US 7,274,058 B2
(45) Date of Patent: Sep. 25, 2007

(54) FERROELECTRIC/PARAELECTRIC MULTILAYER THIN FILM, METHOD OF FORMING THE SAME, AND HIGH FREQUENCY VARIABLE DEVICE USING THE SAME

(75) Inventors: Su Jae Lee, Daejeon (KR); Seung Eon Moon, Daejeon (KR); Han Cheol Ryu, Seoul (KR); Min Hwan Kwak, Daejeon (KR); Kwang Yong Kang, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 98 days.

(21) Appl. No.: 11/180,744

(22) Filed: Jul. 12, 2005

(65) Prior Publication Data
US 2006/0118843 A1    Jun. 8, 2006

(30) Foreign Application Priority Data
Dec. 3, 2004    (KR) ............... 10-2004-0101087

(51) Int. Cl.
*H01L 29/76*    (2006.01)
*H01L 29/94*    (2006.01)
*H01L 31/00*    (2006.01)

(52) U.S. Cl. .............. 257/295; 438/3; 257/E21.664; 257/E21.208

(58) Field of Classification Search ............... None
See application file for complete search history.

(56) References Cited

U.S. PATENT DOCUMENTS 5,504,330 A * 4/1996 Summerfelt et al. ..... 250/338.3
5,514,484 A    5/1996 Nashimoto
5,589,284 A * 12/1996 Summerfelt et al. ........ 428/697
5,640,042 A *  6/1997 Koscica et al. ............. 257/595
6,339,527 B1 * 1/2002 Farooq et al. .............. 361/305

FOREIGN PATENT DOCUMENTS

KR    1020010077095 A    8/2001
KR    1020040047174 A    6/2004

OTHER PUBLICATIONS

B.H. Park, et al., J. Lee, X. Zeng, et al., Effects of very thin strain layers on dielectric properties of epitaxial $Ba_{0.6}Sr_{0.4}TiO_3$ films, *Applied Physics Letters*, vol. 78, No. 4, Jan. 22, 2001.

* cited by examiner

*Primary Examiner*—Evan Pert
*Assistant Examiner*—Benjamin P. Sandvik
(74) *Attorney, Agent, or Firm*—Blakely Sokoloff Taylor & Zafman

(57) ABSTRACT

A ferroelectric/paraelectric multilayer thin film having a high tuning rate of a dielectric constant and small dielectric loss to overcome limitations of a tuning rate of a dielectric constant and dielectric loss of a ferroelectric thin film, a method of forming the same, and a high frequency variable device having the ferroelectric/paraelectric multilayer thin film are provided. The ferroelectric/paraelectric multilayer thin film includes a perovskite $ABO_3$ structure paraelectric seed layer formed on a substrate, and an epitaxial ferroelectric $(Ba_xSr_{1-x})TiO_3$ thin film formed on the paraelectric seed layer. The high frequency variable device can realize a RF frequency/phase variable device having a high speed, low power consumption, and low prices and excellent microwaves characteristics.

11 Claims, 7 Drawing Sheets

FERROELECTRIC/PARAELECTRIC MULTILAYER THIN FILM, METHOD OF FORMING THE SAME, AND HIGH FREQUENCY VARIABLE DEVICE USING THE SAME

CROSS-REFERENCE TO RELATED PATENT APPLICATION

This application claims the benefit of Korean Patent Application No. 10-2004-0101087, filed on Dec. 3, 2004, in the Korean Intellectual Property Office, the disclosure of which is incorporated herein in its entirety by reference.

BACKGROUND OF THE INVENTION

1. Field of the Invention

The present invention relates to a ferroelectric/paraelectric multilayer thin film, a method of forming the same, and a high frequency variable device using the same, and more particularly, to a ferroelectric/paraelectric multilayer thin film composed of a barium-strontium-titanium thin film, a method of forming the same, and a high frequency variable device using the same.

2. Description of the Related Art

Recently, new services, such as high capacity next-generation wideband broadcast, communication, internet-combined mobile wireless multimedia system, ubiquitous communication, sensor system and the like, are realized into actualities. Therefore, development of new essential materials and components for wireless mobile/satellite communication and sensing systems having characteristics of a high speed, low power consumption and a low price enough to provide many services in various frequency bands is now being directed into importance. Therefore, it is highly demanded on technology development for ferroelectric thin film materials and devices, which are expected to complement the advantages and disadvantages of devices characteristics realized as existing semiconductors, micro-electromechanical systems (MEMS), magnetic substances, photonics, and to achieve excellent high frequency characteristics.

A high frequency frequency/phase variable device using such a ferroelectric thin film has characteristics of a high speed, low power consumption, small size, light weight, low price, high frequency/phase variable characteristics, broadband, system on a chip (SoC). However, the most significant problems in the development of the high frequency frequency/phase variable device using such a ferroelectric thin film are their high insertion losses, frequency/phase variable rate, high operation voltage and the like. Many efforts have been made to develop materials for ferroelectric epitaxial thin films having an excellent high frequency dielectric property and devices using the same in order to improve the characteristics of the high frequency ferroelectric variable devices. To this end, a ferroelectric epitaxial thin film material is required to have a high tuning rate of a dielectric constant and a small dielectric loss.

Among many ferroelectric materials, barium-strontium-titanate ($Ba_{1-x}Sr_xTiO_3$) (hereinafter, referred to as "BST") is known as a thin film material good enough to realize a ferroelectric high frequency variable device because of its high tuning rate of a dielectric constant and a small dielectric loss. Further, many studies are being made to improve the device characteristics by improvement of dielectric properties, such as a high tuning rate of a dielectric constant and small dielectric loss of a BST thin film.

Up to now, many researches have been made on doping, a high growth temperature, defect compensation of a Ba/Sr ratio, thickness dependency, and the like to provide a BST thin film having a high dielectric constant tuning rate and small dielectric loss. However, there is limitation in achieving a BST thin film having properties comparable to dielectric properties of BST single crystal. A tuning rate of a dielectric constant and dielectric loss of a ferroelectric BST thin film grown on the single crystal oxide are known to be significantly influenced by oxygen vacancies, a thickness of a thin film, a size of crystalline particle, doping element, a Ba/Sr composition ratio, strain/stress inside a thin film, crystallinity of a thin film, thin film growth conditions such as temperature, oxygen partial pressure, growth rate, and the like. Particularly, epitaxial growth of a BST thin film is not easy at a low temperature due to large difference of lattice constants between the BST thin film and oxide single crystal substrate, and further, high strain/stress inside the thin film is known as a main reason to deteriorate a tuning rate of a dielectric constant and dielectric loss. Because of that, propagation loss of high frequency signals is increased, and a ferroelectric high frequency variable device having effective and excellent characteristics was difficult to realize.

SUMMARY OF THE INVENTION

The present invention provides a ferroelectric/paraelectric multilayer thin film as a new structure having a high tuning rate of a dielectric constant and small dielectric loss.

The present invention also provides a method of forming a ferroelectric/paraelectric multilayer thin film for forming a ferroelectric thin film more easily with lower price to optimize dielectric properties of the thin film.

The present invention also provides a ferroelectric high frequency variable device being excellent in a high speed, low power consumption and low prices and having excellent microwaves characteristic.

According to an aspect of the present invention, there is provided a ferroelectric/paraelectric multilayer thin film including a perovskite $ABO_3$ structure paraelectric seed layer formed on a substrate; and an epitaxial ferroelectric ($Ba_xSr_{1-x}$)$TiO_3$ thin film formed on the paraelectric seed layer.

Preferably, the substrate is a magnesium oxide (MgO) single crystal substrate.

Preferably, the paraelectric seed layer may be composed of a material selected from the group consisting of $SrZrO_3$, $BaZrO_3$, $Ba(Zr_x, Ti_{1-x})O_3$ (x>0.2), $Ba(Hf_x, Ti_{1-x})O_3$ (x>0.24) and $Ba(Sn_x, Ti_{1-x})O_3$ (x>0.15).

Preferably, x of the ($Ba_xSr_{1-x}$)$TiO_3$ thin film may be in the range of 0 through 1.

According to another aspect of the present invention, there is provided a method of forming a ferroelectric/paraelectric multilayer thin film including forming a perovskite $ABO_3$ structure paraelectric seed layer on a substrate. Then, a ferroelectric ($Ba_xSr_{1-x}$)$TiO_3$ thin film is epitaxially grown on the paraelectric seed layer.

The paraelectric seed layer and the ($Ba_xSr_{1-x}$)$TiO_3$ thin film may be formed of epitaxially grown thin films respectively formed using one selected from pulsed laser ablation, RF magnetron sputtering, chemical vapor deposition and atomic layer deposition.

According to another aspect of the present invention, there is provided a high frequency variable device including a substrate; a ferroelectric/paraelectric multilayer thin film including a perovskite $ABO_3$ structure paraelectric seed layer and an epitaxial ferroelectric ($Ba_xSr_{1-x}$)$TiO_3$ thin film, which are sequentially formed on the substrate; and at least one electrode formed on the ferroelectric thin film.

The electrode may be composed of an electrode of a frequency variable device or a phase variable device.

For example, the high frequency variable device may constitute one device selected from the group consisting of a voltage control variable capacitor, a variable resonator, a variable filter, a phase shifter, a voltage control oscillator, a duplexer, a variable divider.

The ferroelectric/paraelectric multilayer thin film according to the present invention has a high tuning rate of a dielectric constant and small dielectric loss with externally applied voltages, and may further improve a high frequency response characteristic of a high frequency variable device. The high frequency variable device according to the present invention can be employed to high speed and capacitance of next-generation wideband broadcast, communication, internet-combined mobile wireless multimedia systems, and sensing systems.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. Like numbers refer to like elements throughout the specification.

Figure 1:
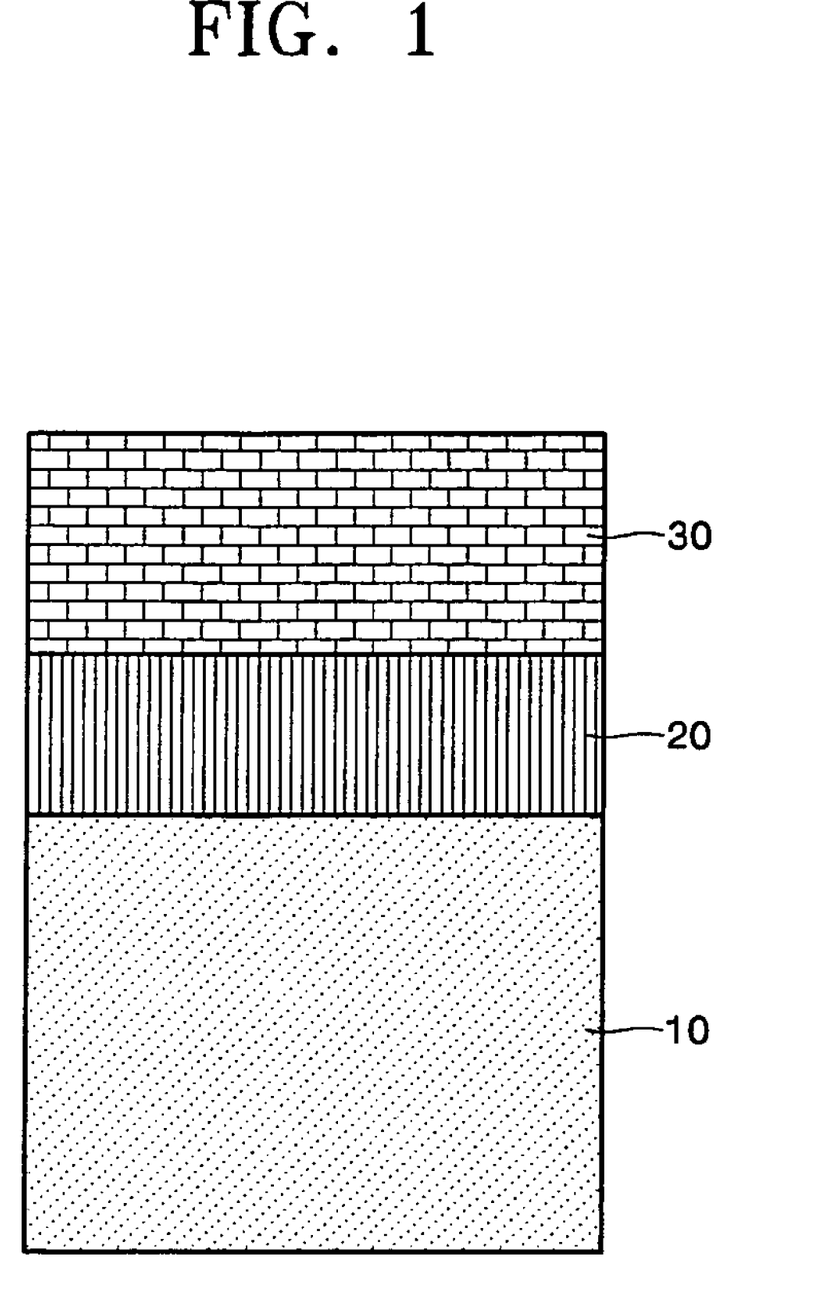
FIG. 1 is a sectional view illustrating a ferroelectric/paraelectric multilayer thin film according to an embodiment of the present invention.

FIG. 1 is a sectional view illustrating a ferroelectric/paraelectric multilayer thin film according to an embodiment of the present invention.

Referring to FIG. 1, a ferroelectric thin film of the present invention includes a paraelectric seed layer 20, which is composed of perovskite compound represented by a general formula of $ABO_3$ (hereinafter, referred to as "perovskite $ABO_3$ structure"), formed with a predetermined thickness on a oxide single crystal substrate 10, and a ferroelectric $(Ba_xSr_{1-x})TiO_3$ thin film 30 epitaxially formed on the paraelectric seed layer 20.

Preferably, the substrate 10 may be formed of a magnesium oxide (MgO) single crystal substrate.

The paraelectric seed layer 20 may be composed of a material selected from the group consisting of $SrZrO_3$, $BaZrO_3$, $Ba(Zr_x, Ti_{1-x})O_3$ (x>0.2), $Ba(Hf_x, Ti_{1-x})O_3$ (x>0.24) and $Ba(Sn_x, Ti_{1-x})O_3$ (x>0.15).

Preferably, the $(Ba_xSr_{1-x})TiO_3$ thin film 30 has a composition that x is equal to 0 through 1.

The paraelectric seed layer 20 may be formed with a thickness of several Å through several hundreds Å, and the $(Ba_xSr_{1-x})TiO_3$ thin film 30 may be formed with a thickness of about 0.1~1 μm.

Figure 2:
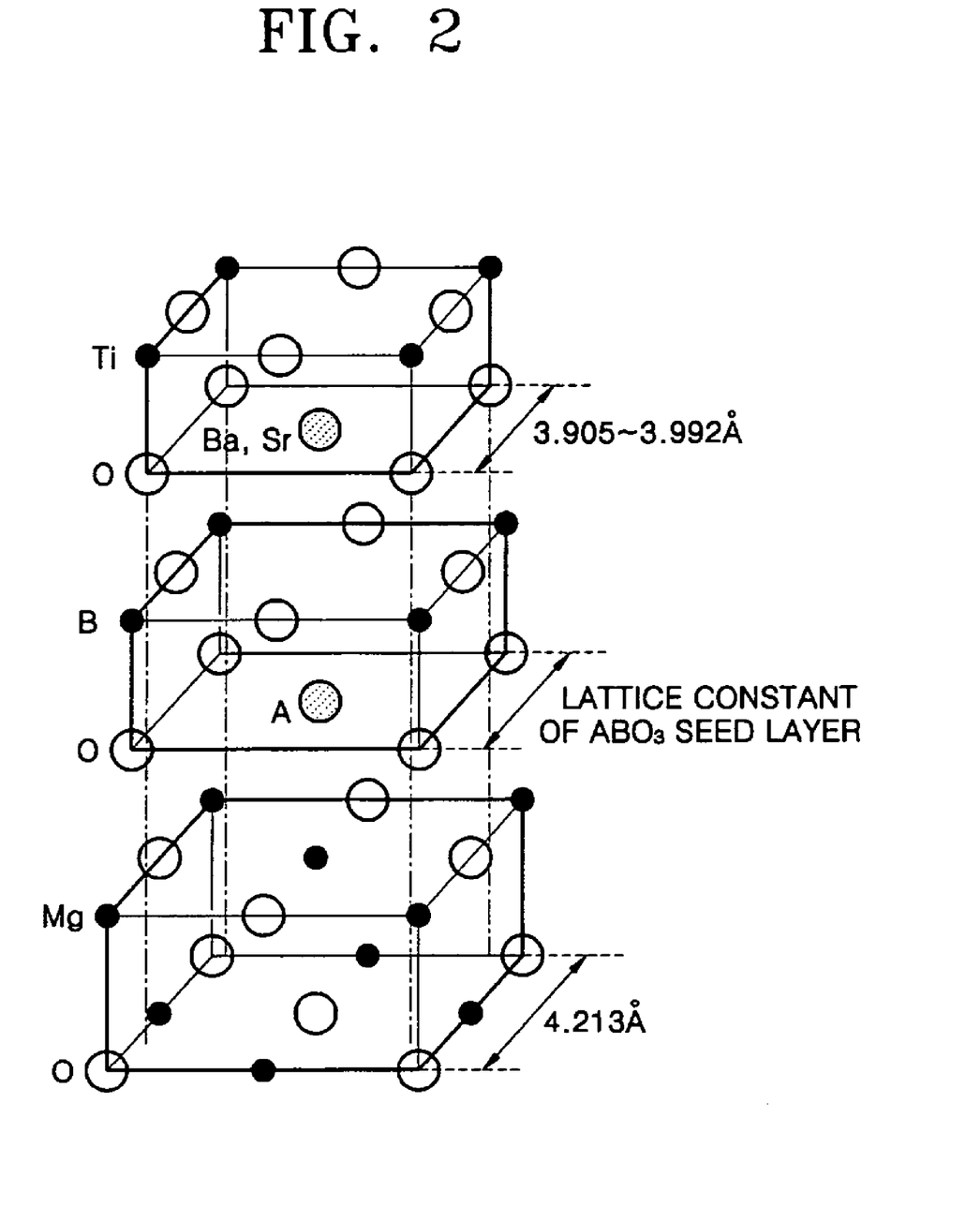
FIG. 2 illustrates a crystalline structure of a ferroelectric/paraelectric multilayer thin film according to an embodiment of the present invention.

FIG. 2 illustrates a crystalline structure of a ferroelectric/paraelectric multilayer thin film according to an embodiment of the present invention.

In the crystalline structure of FIG. 2, an $ABO_3$ structure paraelectric seed layer and a $(Ba_xSr_{1-x})TiO_3$ thin film are sequentially stacked on a magnesium oxide (MgO) single crystal substrate.

Major features of the ferroelectric/paraelectric multilayer thin film according to the present invention are to reduce a discrepancy in a lattice constant between the substrate 10 and the $(Ba_xSr_{1-x})TiO_3$ thin film 30, which may deteriorate a dielectric property of the $(Ba_xSr_{1-x})TiO_3$ thin film 30 grown on the substrate 10 and to reduce the strain/stress inside the $(Ba_xSr_{1-x})TiO_3$ thin film 30 generated by the lattice constant discrepancy, thereby improving the dielectric property of the $(Ba_xSr_{1-x})TiO_3$ thin film 30.

In specific, the thin perovskite $ABO_3$ structure paraelectric seed layer 20 is formed on the substrate 10. A lattice constant difference between the paraelectric seed layer 20 and the substrate 10 is small. The $(Ba_xSr_{1-x})TiO_3$ thin film 30 is epitaxially grown on the paraelectric seed layer 20. As such, a crystallinity of the $(Ba_xSr_{1-x})TiO_3$ thin film 30 as well as a dielectric property thereof can be improved.

The substrate 10 uses a magnesium oxide (MgO) (100) single crystal substrate suitable to being used for high frequency devices. The (MgO) (100) substrate has a cubic NaCl structure. A lattice constant of MgO is 4.213 Å. The perovskite $ABO_3$ structure paraelectric seed layer 20 has a lattice constant of an approximately intermediate value between lattice constants of the substrate 10 and the $(Ba_xSr_{1-x})TiO_3$ thin film 30.

Table 1 shows the lattice constants of the substrate 10, the perovskite $ABO_3$ structure paraelectric seed layer 20, and the $(Ba_xSr_{1-x})TiO_3$ thin film 30, and lattice constant differences between them.

TABLE 1

| substrate and perovskite $ABO_3$ structure crystal | | crystal structure | lattice constant (Å) | lattice constant difference | |
|---|---|---|---|---|---|
| | | | | MgO substrate (a = 4.213 Å) | $(Ba_x, Sr_{1-x})TiO_3$ (x = 0~1) (a = 3.905~3.992 Å) |
| substrate | MgO substrate | pseudo-cubic | 4.213 | 0 | −7.3~−5.2% |
| $ABO_3$ | $SrZrO_3$ | Cubic | 4.099 | −2.6% | −4.7~−2.6% |

TABLE 1-continued

| substrate and perovskite ABO₃ structure crystal | crystal structure | lattice constant (Å) | lattice constant difference | |
|---|---|---|---|---|
| | | | MgO substrate (a = 4.213 Å) | $(Ba_x, Sr_{1-x})TiO_3$ (x = 0~1) (a = 3.905~3.992 Å) |
| $BaZrO_3$ | Cubic | 4.192 | −0.5% | −6.8~−4.8% |
| $Ba(Zr_x, Ti_{1-x})O_3$ (x > 0.2) | Cubic | 4.042 | −4.1% | −3.4~−1.2% |
| $Ba(Hf_x, Ti_{1-x})O_3$ (x > 0.24) | Cubic | 4.045 | −4.0% | −3.5~−1.3% |
| $Ba(Sn_x, Ti_{1-x})O_3$ (x > 0.15) | Cubic | 4.030 | −4.3% | −3.1~−0.9% |

In Table 1, the lattice constant difference between the substrate 10 and the $(Ba_xSr_{1-x})TiO_3$ thin film 30 is large, that is, −7.3~−5.2%. Thus, it is difficult to epitaxially grow the $(Ba_xSr_{1-x})TiO_3$ thin film 30 on the substrate 10.

However, the ferroelectric/paraelectric multilayer thin film of the present invention is structured such that the perovskite $ABO_3$ structure paraelectric seed layer 20 is interposed between the substrate 10 and the $(Ba_xSr_{1-x})TiO_3$ thin film 30, and the lattice constant of the perovskite $ABO_3$ structure paraelectric seed layer 20 has an intermediate value between the lattice constants of the substrate 10 and the $(Ba_xSr_{1-x})TiO_3$ thin film 30. Thus, the lattice constant difference between the substrate 10 and the $(Ba_xSr_{1-x})TiO_3$ thin film 30 can be reduced, and the epitaxial growth is easier to realize.

In the ferroelectric/paraelectric multilayer thin film of the present invention, the perovskite $ABO_3$ structure paraelectric seed layer 20 preferably has a thickness of several Å through several hundreds Å. The paraelectric seed layer 20 having a thickness greater than the above range may deteriorate high frequency characteristic of a device due to the dielectric property expression of the paraelectric seed layer 20, but adversely, the paraelectric seed layer 20 having a thickness smaller than the above range cannot function as a seed layer, thereby resulting in difficulty to epitaxially grow the $(Ba_xSr_{1-x})TiO_3$ thin film 30. The $(Ba_xSr_{1-x})TiO_3$ thin film 30 formed on the perovskite $ABO_3$ structure paraelectric seed layer 20 preferably has a thickness of about 0.1 to 1 μm.

The x of the $(Ba_xSr_{1-x})TiO_3$ thin film 30 is appropriately in the range of 0 through 1. As shown in FIG. 2, the lattice constant of the a-axis has a value of 3.905 to 3.992 Å depending on x.

A method of growing the perovskite $ABO_3$ structure paraelectric seed layer 20 and the $(Ba_xSr_{1-x})TiO_3$ thin film 30 on the substrate 10 as a magnesium oxide (MgO) (001) single crystal substrate is not limited, but the layers can be formed through various methods. For example, the paraelectric seed layer 20 and the $(Ba_xSr_{1-x})TiO_3$ thin film 30 may be epitaxially grown using one method selected from pulsed laser ablation, RF magnetron sputtering, chemical vapour deposition, and atomic layer deposition.

Figure 3:
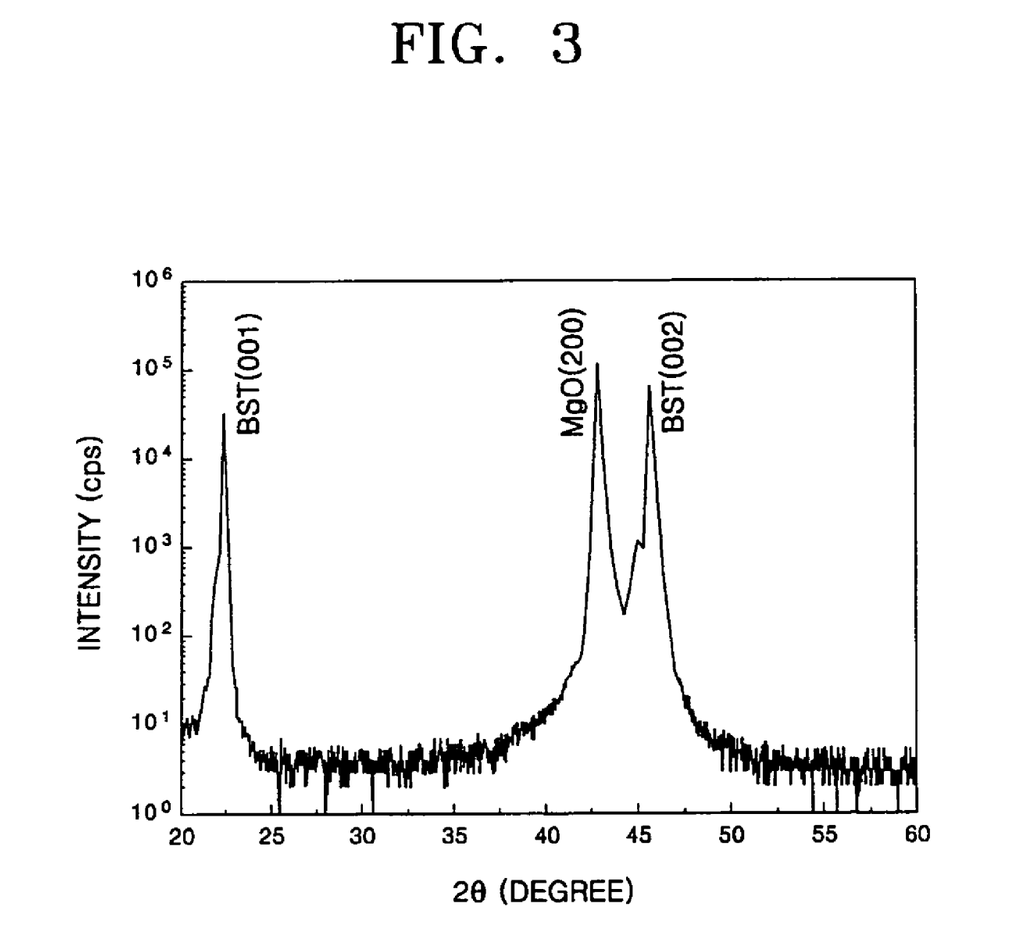
FIG. 3 illustrates θ-2θ X-ray diffraction pattern of an exemplary ferroelectric/paraelectric multilayer thin film according to the present invention.

FIG. 3 illustrates θ-2θ X-ray diffraction pattern of an exemplary ferroelectric/paraelectric multilayer thin film according to the present invention after a perovskite $ABO_3$ structure paraelectric seed layer is formed on a magnesium oxide (MgO) (001) single crystal substrate by pulsed laser ablation and then, a $(Ba_xSr_{1-x})TiO_3$ thin film (hereinafter, referred to as "BST thin film") is formed on the perovskite $ABO_3$ structure paraelectric seed layer.

For the experiment of FIG. 3, the thin perovskite $ABO_3$ structure paraelectric seed layer and the BST thin film are formed under the growth conditions of a temperature of 750° C., and an oxygen pressure of 200 mTorr. As shown in FIG. 3, the BST thin film had (001) and (002) X-ray diffraction peaks, and an epitaxial thin film was formed.

In the meantime, in order to realize a ferroelectric high frequency variable device having an excellent high frequency characteristics, the ferroelectric thin film is required to have a high tuning rate of its dielectric constant and low dielectric loss.

Hereinafter, an example of employing a ferroelectric/paraelectric multilayer thin film to a high frequency variable device according to the present invention will be explained in detail with reference to the accompanying drawings.

The high frequency variable device using the ferroelectric/paraelectric multilayer thin film according to the present invention is a frequency or phase-variable device, and uses a physical property that dielectric constant varies depending on externally applied voltages, and provides excellent characteristics in comparison with existing mechanical or electrical variable devices.

Examples of high frequency variable devices suitable to employing the ferroelectric/paraelectric multilayer thin film of the present invention include a voltage control variable capacitor, a phase shifter, a variable resonator, a variable filter, a voltage control variable oscillator, a duplexer, a variable divider, and the like. Hereinafter, cases of a voltage control variable capacitor and a coplanar waveguide type phase shifter fabricated by applying an electrode material to realize the device characteristics on a BST/$ABO_3$ structure paraelectric seed layer/MgO piece having an improved dielectric property will be explained as an example.

Figure 4:
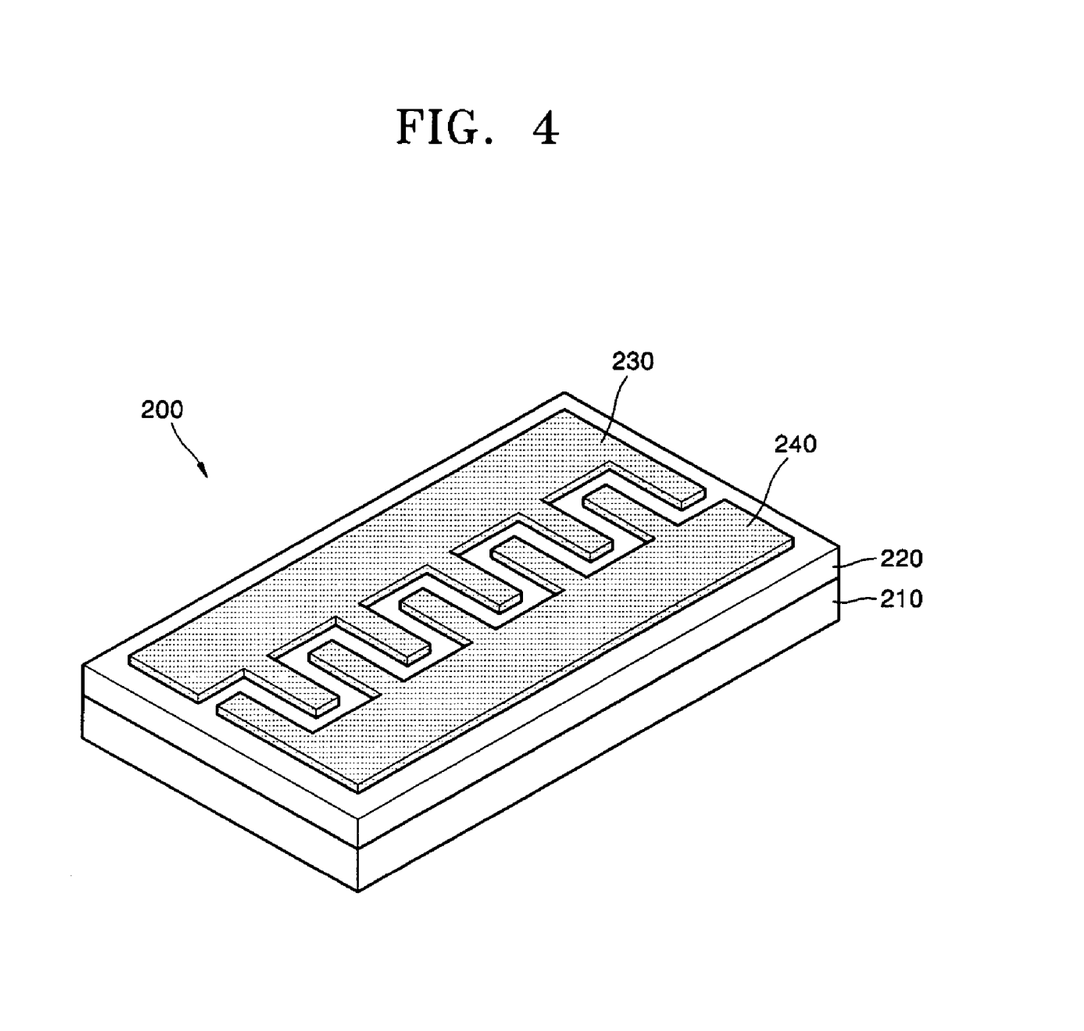
FIG. 4 is a perspective view of a voltage control variable capacitor as one example of a high frequency variable device according to the present invention.

FIG. 4 is a perspective view of a voltage control variable capacitor 200 as one example of a high frequency variable device fabricated using an epitaxial BST/$ABO_3$ structure paraelectric seed layer/MgO piece according to the present invention.

Referring to FIG. 4, the voltage control variable capacitor 200 is structured such that a perovskite $ABO_3$ structure paraelectric seed layer and a BST thin film as a ferroelectric/paraelectric multilayer thin film 220 are sequentially stacked on a MgO substrate 210. Metal electrodes 230, 240 are formed on the ferroelectric/paraelectric multilayer thin film 220. The voltage control variable capacitor 200 structured as above can be used in a variable filter for microwave and millimeter band for civilian/military application, a variable capacitor, a resonator, a phase shifter circuit, and the like.

The process of fabricating the device exemplified in FIG. 4 can be easily performed using a typical photolithography process. For example, after forming a perovskite $ABO_3$ structure paraelectric seed layer on a magnesium oxide (MgO) (001) single crystal substrate using pulsed laser ablation, a BST thin film is formed. Then, a metal electrode is formed on the BST thin film. The metal electrode may be formed as a single layer composed of a metal selected from Au, Ag, Al, Cu, and the like. Alternatively, in order to form the metal electrode, a thin adhesion layer, which is composed of Cr or Ti, is first deposited on the BST thin film, and a metal selected from Au, Ag, Cu and the like is formed with a thickness about three times the skin depth of microwaves so as to form a multi-layered metal layer composed of Au/Cr, Au/Ti, Ag/Cr, Ag/Ti, Al/Cr, Al/Ti, and the like.

Figure 5A:
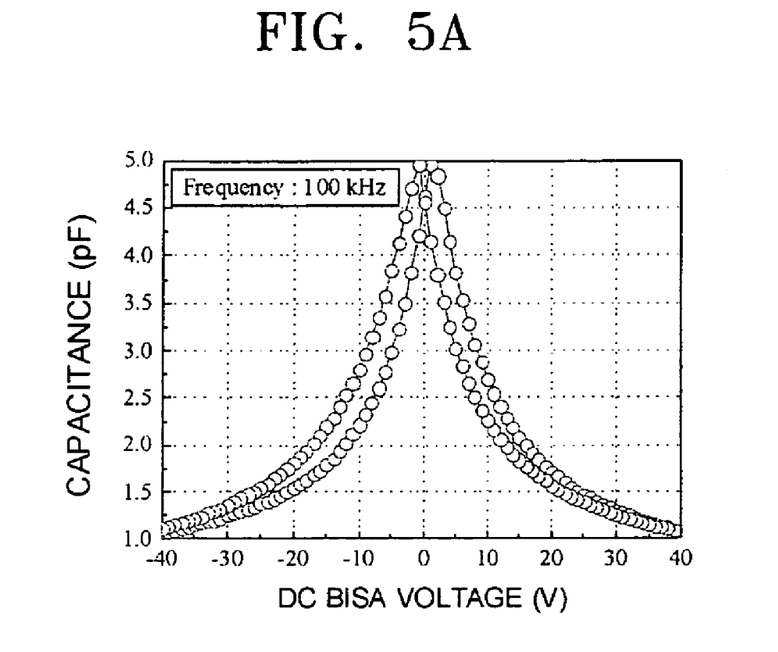
FIGS. 5A and 5B are graphs illustrating a capacitance and a dielectric loss with variance of voltages applied to the voltage control variable capacitor of FIG. 4.
Figure 5B:
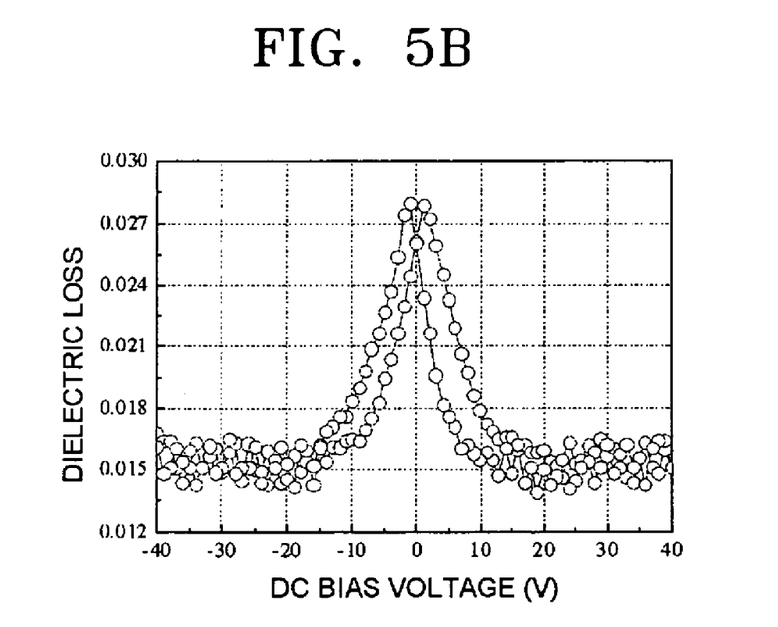

FIGS. 5A and 5B are graphs illustrating a capacitance and a dielectric loss with variance of voltages applied to the voltage control variable capacitor of FIG. 4. When DC bias voltage is applied to upper both ends electrodes 230, 240 of the voltage control variable capacitor, a dielectric constant and a dielectric loss of the BST thin film are changed, and thus, a capacitance of the variable capacitor is changed. Thus, in the case that a variable filter or phase shifting device is fabricated using the variable capacitor, frequency/phase is varied.

Referring to FIGS. 5A and 5B, when DC bias voltage is applied with variance from 0 to 40 V, a tuning rate of a capacitance $[\{C(0V)-C(40V)\}/C(0V)]$ (or dielectric constant) showed 78% or higher, and a dielectric constant showed a value of 0.014~0.028. The improved dielectric properties as above are due to the structure fabricated by forming the thin perovskite $ABO_3$ structure paraelectric seed layer on the MgO substrate, and forming the BST thin film thereon to improve the crystallinity of the BST thin film, and the reduction of the strain/stress effect inside the BST thin film caused by a lattice constant difference between the substrate and the BST thin film.

Figure 6:
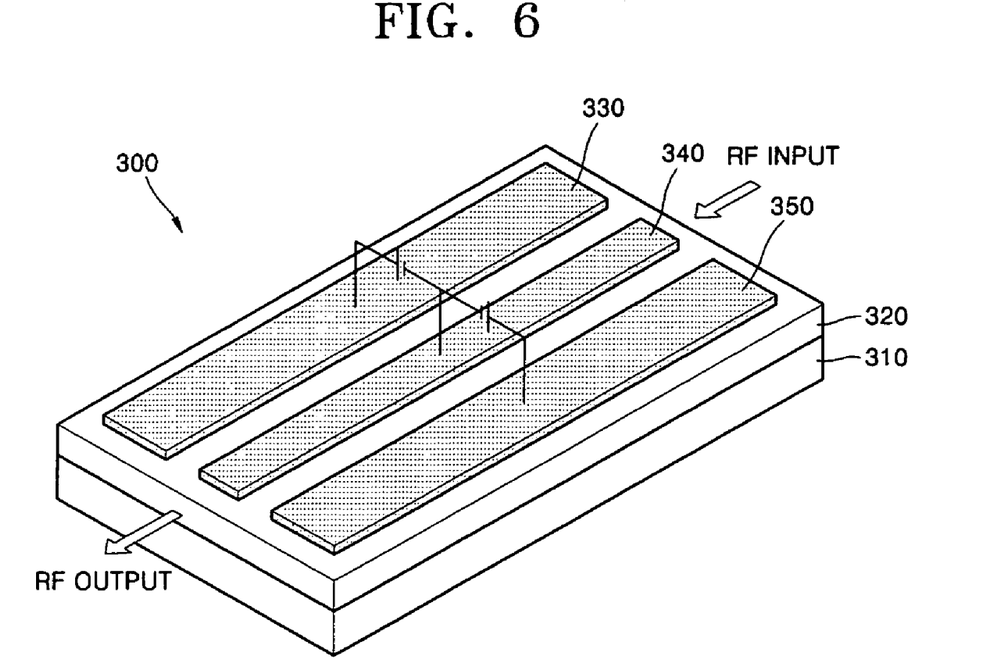
FIG. 6 is a perspective view of a coplanar waveguide type phase shifter as another example of the high frequency variable device according to the present invention.

FIG. 6 is a perspective view of a coplanar waveguide type phase shifter 300 as another example of the high frequency variable device according to the present invention. The coplanar waveguide type phase shifter 300 of FIG. 6 is structured such that a perovskite $ABO_3$ structure paraelectric seed layer and a BST thin film as a ferroelectric/paraelectric epitaxial thin film 320 of the present invention are sequentially stacked on a substrate 310. A plurality of metal electrodes 330, 340, 350 are formed on the ferroelectric/paraelectric epitaxial thin film 320.

The coplanar waveguide type phase shifter 300 can be used as an essential device, which is connected to each radiating element of a phase array antenna, and allows scanning/steering of electronic beams. Further, size, weight, and price of the phase array antenna can be reduced due to the structure since it provides advantages of high speed, low power consumption, low price, compact size, and high performance electronic scanning, and a phase array antenna with high speed ferroelectric electronic scanning can be provided since the scanning of the antenna beam can be controlled using only a precise controller and a voltage amplifier even without mechanical or physical rotation of the antenna. Further, the coplanar waveguide type phase shifter 300 can be also used as an essential element for a phase array antenna in microwave and millimeter wave band for civilian or military applications.

The structure of the ferroelectric phase shifter is not limited to this illustrated here, and can be employed in the same way to a loaded line type phase shifter, a coupled microstripline type phase shifter, a reflection type phase shifter, and the like.

Figure 7A:
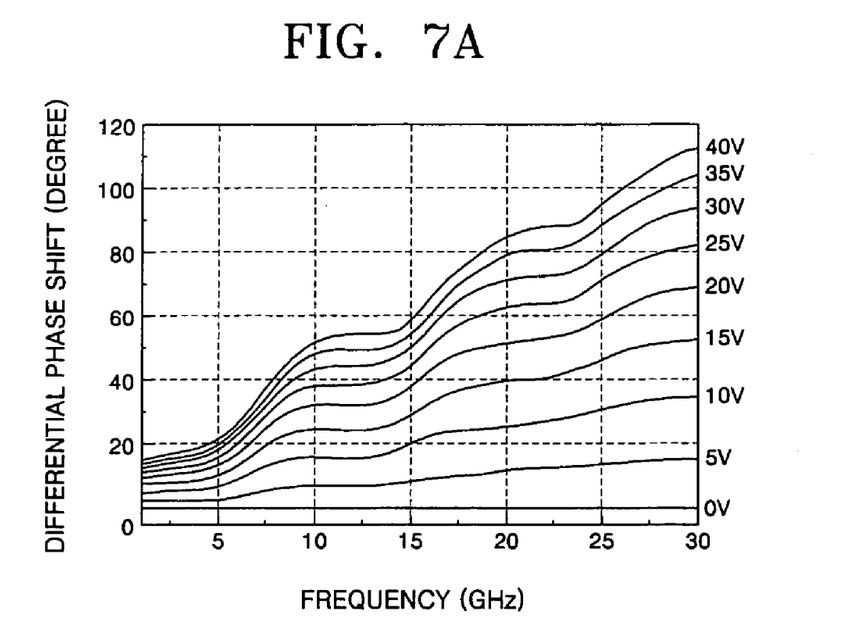
FIGS. 7A, 7B and 7C are graphs illustrating a differential phase shift and a insertion loss characteristic in accordance with frequencies and applied DC bias voltages in the coplanar waveguide type phase shifter of FIG. 6.
Figure 7B:
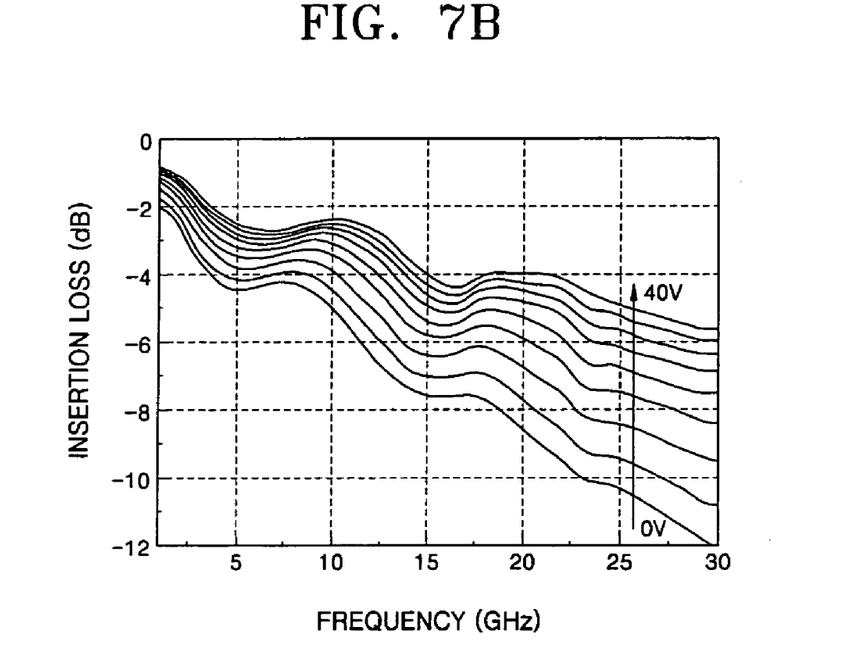
Figure 7C:
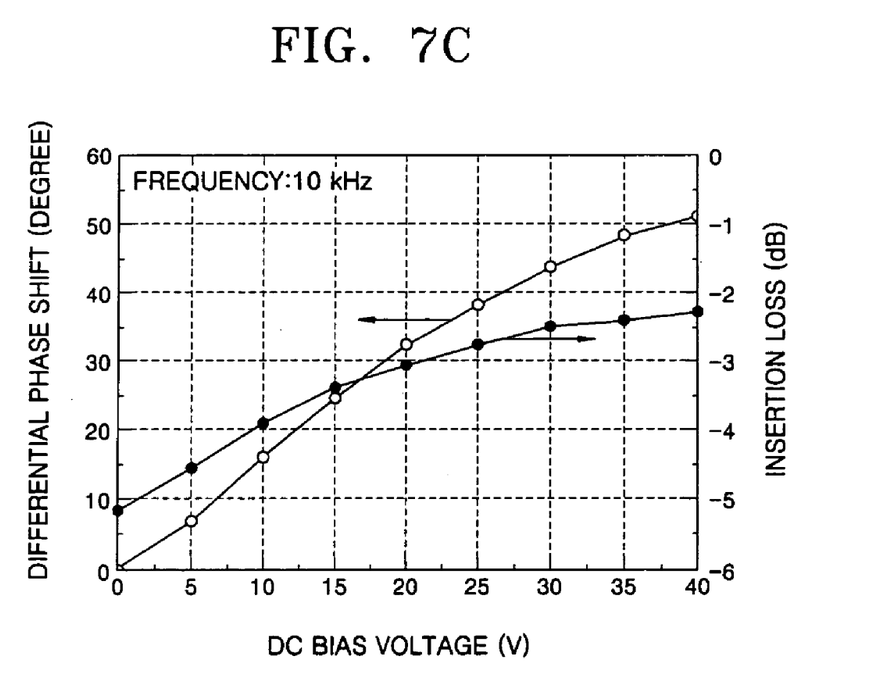

FIGS. 7A, 7B and 7C are graphs illustrating a differential phase shift and a insertion loss characteristic in accordance with frequencies and applied DC bias voltages in the coplanar waveguide type phase shifter 300 of FIG. 6.

Referring to FIGS. 7A, 7B and 7C, the differential phase shift shows a difference of phases when 0V and 40V are applied respectively, and the differential phase shift is related with a dielectric constant tuning rate of the BST thin film. A higher dielectric constant tuning rate increases the differential phase shift. In the case that the coplanar waveguide type phase shifter is actually used in a system such as a phase array antenna, a value as high as 360 degree is normally required depending on application systems. The device with 3 mm transmission line fabricated using the epitaxial BST/perovskite $ABO_3$ structure paraelectric seed layer/MgO piece according to the present invention showed 51 degree of differential phase shift and −5.1~−2.3 dB of insertion loss at 10 GHz under 40V of applied DC bias voltage. The excellent phase shift characteristic as above was that the crystallinity of the BST thin film was improved by forming the BST thin film on the perovskite $ABO_3$ structure paraelectric seed layer, and the tuning rate of the dielectric constant was improved since the strain/stress inside the BST thin film was reduced.

The present invention has been described in specific with exemplary embodiments, but the embodiments were just taken as examples to explain the present invention, and are not intended to limit the scope of the present invention. That is, the voltage control variable capacitor and the coplanar waveguide type phase shifter have been exemplified in the embodiments, but the present invention can be employed to frequency/phase variable devices of microwave and millimeter wave band using the ferroelectric thin film without any limitation of a specific structure.

The ferroelectric/paraelectric multilayer thin film of the present invention is appropriate to be used in a high frequency variable device. The ferroelectric/paraelectric multilayer thin film of the present invention shows a high dielectric constant tuning rate and a small dielectric loss with an externally applied voltage, and further improves high frequency response characteristics of the high frequency variable device. The high frequency variable device employing the ferroelectric/paraelectric multilayer thin film according to the present invention can be employed to communication and sensing systems such as next generation wideband broadcast, communication, internet-combined mobile wireless multimedia services with a high speed and a high capacitance to maximably ensure the wireless communication quality with a high speed, low power consumption, a low price, and a high sensitivity. Particularly, the voltage control variable capacitor, variable filter, and phase shifter employing the epitaxially grown ferroelectric thin film with a high speed, low power consumption, and a low price can be widely used in wireless communication systems for civilian/military applications with microwave and millimeter wave band.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A ferroelectric/paraelectric multilayer thin film comprising:
    a substrate having a first lattice constant;
    a perovskite $ABO_3$ structure paraelectric seed layer formed on the substrate, wherein the paraelectric seed layer has a second lattice constant less than the first lattice constant; and an epitaxial ferroelectric $(Ba_xSr_{1-x})TiO_3$ thin film formed on the paraelectric seed layer, wherein the $(Ba_xSr_{1-x})TiO_3$ thin film has a third lattice constant less than the second lattice constant.

2. The ferroelectric/paraelectric multilayer thin film according to claim 1, wherein the paraelectric seed layer is composed of a material selected from the group consisting of $SrZrO_3$, $BaZrO_3$, $Ba(Zr_x, Ti_{1-x})O_3$ (x>0.2), $Ba(Hf_x, Ti_{1-x})O_3$ (x>0.24) and $Ba(Sn_x, Ti_{1-x})O_3$ (x>0.15).

3. The ferroelectric/paraelectric multilayer thin film according to claim 1, wherein x of the $(Ba_xSr_{1-x})TiO_3$ thin film is in the range of 0 through 1.

4. A method of forming a ferroelectric/paraelectric multilayer thin film comprising:

forming a perovskite $ABO_3$ structure paraelectric seed layer on a substrate having a first lattice constant, wherein the paraelectric seed layer has a second lattice constant less than the first lattice constant; and epitaxially growing a ferroelectric $(Ba_xSr_{1-x})TiO_3$ thin film on the paraelectric seed layer, wherein the $(Ba_xSr_{1-x})TiO_3$ thin film has a third lattice constant less than the second lattice constant.

5. The method according to claim 4, wherein the paraelectric seed layer is an epitaxially grown thin film formed using one selected from pulsed laser ablation, RF magnetron sputtering, chemical vapor deposition and atomic layer deposition.

6. The method according to claim 4, wherein the $(Ba_xSr_{1-x})TiO_3$ thin film is an epitaxially grown thin film formed using one selected from pulsed laser ablation, RF magnetron sputtering, chemical vapor deposition and atomic layer deposition.

7. A high frequency variable device comprising:

a substrate having a first lattice constant;

a ferroelectric/paraelectric multilayer thin film including a perovskite $ABO_3$ structure paraelectric seed layer and an epitaxial ferroelectric $(Ba_xSr_{1-x})TiO_3$ thin film, which are sequentially formed on the substrate, wherein the paraelectric seed layer has a second lattice constant less than the first lattice constant and the $(Ba_xSr_{1-x})TiO_3$ thin film has a third lattice constant less than the second lattice constant; and at least one electrode formed on the ferroelectric thin film.

8. The high frequency variable device according to claim 7, wherein the substrate is a MgO substrate.

9. The high frequency variable device according to claim 7, wherein the electrode is an electrode of a frequency variable device or a phase variable device.

10. The high frequency variable device according to claim 7, wherein the electrode is composed of a single-layered metal layer or a multi-layered metal layer selected from the group consisting of Au, Ag, Al, Cu, Cr and Ti.

11. The high frequency variable device according to claim 7, wherein the high frequency variable device constitutes one device selected from the group consisting of a voltage control variable capacitor, a variable resonator, a variable filter, a phase shifter, a voltage control oscillator, a duplexer, a variable divider.

* * * * *